United States Patent [19]

Backus et al.

[11] Patent Number: 5,410,193
[45] Date of Patent: Apr. 25, 1995

[54] APPARATUS AND TECHNIQUE FOR CONNECTING A SOURCE OF ZERO CROSSING AC VOLTAGE TO AND DISCONNECTING IT FROM AN AC LOAD LINE

[75] Inventors: Richard J. Backus; Lee A. Finch, both of Rochester, N.Y.

[73] Assignee: Eastman Kodak Company, Rochester, N.Y.

[21] Appl. No.: 956,921

[22] Filed: Oct. 2, 1992

[51] Int. Cl.$^6$ ...................... H03K 5/153; H03K 17/13
[52] U.S. Cl. ...................................... 327/79; 327/451
[58] Field of Search ............... 307/491, 354, 647, 648; 328/155

[56] References Cited

U.S. PATENT DOCUMENTS

| | | | |
|---|---|---|---|
| 3,223,888 | 12/1965 | Koppelmann | 361/10 |
| 3,309,602 | 3/1967 | Euvino et al. | 363/125 |
| 3,348,121 | 10/1967 | Murthy | 361/2 |
| 3,402,302 | 9/1992 | Coburn | 361/6 |
| 3,440,445 | 4/1969 | Kusa | 307/648 |
| 3,443,204 | 5/1969 | Baker | 323/319 |
| 3,491,284 | 1/1970 | Pascente | 323/319 |
| 3,808,455 | 4/1974 | Leisi | 361/3 |
| 3,862,439 | 1/1975 | Coccio | 307/647 |
| 3,914,625 | 10/1975 | Billings et al. | 307/647 X |
| 4,038,584 | 7/1977 | Tarchalski et al. | 361/104 |
| 4,051,394 | 9/1977 | Tieden | 307/354 X |
| 4,056,836 | 11/1977 | Knauer | 361/4 |
| 4,068,273 | 1/1978 | Metzler | 361/3 |
| 4,176,288 | 11/1979 | Komatsu et al. | 307/647 X |
| 4,245,184 | 1/1981 | Billings et al. | 323/235 |
| 4,356,525 | 10/1982 | Kornrumpf et al. | 361/4 |
| 4,370,564 | 1/1983 | Matsushita | 307/140 |
| 4,626,698 | 12/1986 | Harnden, Jr. et al. | 307/647 X |
| 4,698,721 | 10/1987 | Warren | 361/110 |
| 4,703,191 | 10/1987 | Ferguson | 307/64 |
| 4,703,197 | 10/1987 | Fleischer | 307/646 |
| 4,709,296 | 11/1987 | Hung et al. | 361/102 |
| 4,736,268 | 4/1988 | Wagoner | 361/111 |
| 4,887,180 | 12/1989 | Climent et al. | 361/91 |
| 4,897,755 | 1/1990 | Polster et al. | 361/2 |
| 4,918,566 | 4/1990 | Brodsky et al. | 361/166 |
| 4,922,363 | 5/1990 | Long et al. | 361/3 |
| 4,926,281 | 5/1990 | Murphy | 361/55 |
| 5,055,991 | 10/1991 | Carroll et al. | 363/56 |
| 5,239,209 | 8/1993 | Hoekman | 307/647 X |

FOREIGN PATENT DOCUMENTS

| | | |
|---|---|---|
| 0263653 | 10/1987 | European Pat. Off. . |
| 0353765 | 8/1989 | European Pat. Off. . |
| 2499789 | 2/1981 | France . |
| 2543653 | 4/1977 | Germany . |
| 3733294 | 4/1989 | Germany . |
| 4104273 | 5/1992 | Germany . |
| 59-223 | 1/1984 | Japan . |
| 2069762 | 8/1981 | United Kingdom . |

Primary Examiner—Willis R. Wolfe
Attorney, Agent, or Firm—David A. Hall

[57] ABSTRACT

An arrangement for controlling a zero crossing switch in order to connect a source of zero crossing AC voltage to and disconnecting it from an AC load line is disclosed herein along with its method of operation. To this end, means are provided for producing externally controlled command signals intended to control when the switch connects and disconnects the load line to and from the AC voltage. At the same time, a specific window of time is selected, which window begins a particular period of time prior to and includes at least certain zero crossing points of the AC voltage. Internally controlled command signals are produced in response to the AC voltage and externally controlled signals for actually controlling when the switch connects (ON) and disconnects (OFF) the load to and from the AC voltage. These internally controlled signals are produced such that either an ON or OFF signal, but not both, is produced entirely throughout the specific window of time in order to prevent command signals from switching between ON and OFF states within any given window of time. This, in turn, reduces current surges at the output of the zero crossing switch, thereby reducing electromagnetic interference (EMI).

16 Claims, 4 Drawing Sheets

APPARATUS AND TECHNIQUE FOR CONNECTING A SOURCE OF ZERO CROSSING AC VOLTAGE TO AND DISCONNECTING IT FROM AN AC LOAD LINE

TECHNICAL FIELD

The present invention relates generally to electrical switching techniques and more particularly to a specific technique for controlling a zero crossing switch in order to connect a source of zero crossing AC voltage to and disconnect it from an AC load in a way which reduces current surges at the output of the switch, thereby reducing electromagnetic interference (EMI).

BACKGROUND OF THE INVENTION

Zero crossing switches, zero crossing solid state relays (ZCSSRs) in particular, were designed heretofore to be an inexpensive, effective solution for interface applications between low current DC control circuits and AC power loads. The turn ON/OFF at AC zero crossing feature was expected to minimize current surges which consequently reduces the generation of EMI. Although EMI is always a problem, it becomes a serious problem when "machine operation" is affected or the EMI generated by a "machine" exceeds FCC Regulations. The prior art teaches that ZCSSRs can be turned ON or OFF with no need to consider the ZCSSRs turn ON/OFF signal specifications which will be described hereinafter in conjunction with FIGS. 1 and 2. Heretofore, it has been assumed that if the turn ON/OFF signal specifications were not met at the first zero cross point, the ZCSSR would just wait for the next zero cross point to turn ON/OFF without causing any problems. However, as will be explained in more detail below, Applicants have discovered that the use of random ZCSSR turn ON/OFF command signals relative to the AC line frequency tends to produce excessive conducted EMI. As will also be explained, in detail, synchronizing the ZCSSR ON/OFF command signals with the AC line frequency in accordance with the present invention, such that their ON/OFF signal specifications are never violated, will result in a significant reduction of the conducted EMI levels.

Referring specifically to FIG. 1, the zero crossing switch (ZCS) 10, for example a zero crossing solid state relay, is shown connected in line between a zero crossing AC voltage source 11 and an AC driven load for closing and opening the AC load line in order to connect the AC voltage to and disconnect it from the load. The zero crossing switch is shown being controlled in accordance with the prior art by externally produced command signals 12 which will be described hereinafter in conjunction with FIGS. 3A–3D.

In the meantime, the zero crossing AC voltage used to drive the load illustrated in FIG. 1 is graphically depicted in FIG. 2 at 14. As seen in this latter figure, AC voltage 14 has a constant peak-to-peak amplitude and successive zero crossing points ZC. In the discussion of zero crossing solid state relays above, mention was made of the relays' ON/OFF specifications. As stated there, heretofore it has been assumed that if the turn ON/OFF signal specifications were not met at one zero crossing point, the ZCSSR would just wait for the next zero crossing point to turn ON/OFF without causing any harm. The relays' signal or performance specification requires that an ON signal be present in a predetermined period of time, for example 0.4 milliseconds, before the AC voltages zero crossing point ZC and continue through ZC for the relay to turn ON. It also specifically requires that the OFF signal be present for a predetermined period of time, for example 0.35 milliseconds, before ZC and continue through ZC for the relay to turn off. While most relay performance specifications do not address any required time period for the ON or OFF signal to remain present after ZC, applicants have found that, as a practical matter, such required periods exist. This performance window is indicated by dotted lines at PW in FIG. 2. For purposes of simplicity, only one of the windows, for example the ON window, is illustrated. Thus, in accordance with prior art practice, in order to turn ON zero crossing switch 10 illustrated in FIG. 1 at its zero crossing point ZC, an ON command signal 12 must be present at the beginning of performance window PW and continue throughout the duration of the window.

Referring to FIGS. 3A–3D, a series of externally produced command signals 12A–12D are illustrated. In each case, the negative pulses correspond to ON command signals and the positive pulses correspond to OFF signals. Each series of command signals is shown synchronized (time wise) with AC voltage 14. For purposes of discussions, let it be assumed that the intent of each series of command signals illustrated in FIGS. 3A–3D is to turn on zero crossing switch 10 and thereby connect the AC voltage to its associated load. With particular reference to FIG. 3A, note that the only ON pulse of series 12A falling within performance window PW is the shaded negative pulse. Note further that this later pulse begins well after the beginning of the window and, hence, will not turn ON switch 10, as per its performance specification. Therefore, according to the prior art, the switch 10 waits for another ON pulse and still another one, if necessary, until one such pulse falls entirely within window PW. In the meantime, it should be still further noted that, in the case of series 12A, a transition is made from an OFF pulse to the shaded ON pulse within the performance window. This can happen many times before the performance specification is met and the switch is turned ON. Prior art practice has apparently ignored these transitions as being insignificant. Applicants, on the other hand, have found that these transitions within the performance window can and often do result in significant current surges resulting in significant electromagnetic interference. The signal series 12D shown in FIG. 3D suffers from the same problem as signal series 12A. In FIG. 3B, the shaded negative ON pulse beings prior to performance window PW but transitions to the OFF state within the window. Only signal series 12C in FIG. 3C includes a valid ON pulse (the shaded negative Pulse).

SUMMARY OF THE INVENTION

As will be described in more detail hereinafter, the present invention recognizes and overcomes the problem just recited by providing internally controlled signals in response to externally produced command signals and a zero crossing AC voltage. As will be seen, these internally controlled command signals are used to control a zero crossing switch, in lieu of the externally produced command signals, in order to connect and disconnect a load line from its AC voltage source. In accordance with the present invention these internally controlled command signals are produced such that either an ON or OFF signal, but not both, is present entirely throughout its associated specific window of time PW in order to prevent command signals from transitioning between ON and OFF states within any given window of time.

As will be seen, the present invention provides for a DC controlled switching assembly for connecting a source of zero crossing AC voltage to and disconnecting it from an AC load line. This assembly includes a zero crossing switch connectable with the AC voltage source and AC load line for connecting the load line to and disconnecting it from said voltage source in response to ON and OFF command signals, but only if and when the appropriate command signal is present entirely throughout a window of time beginning a specific period of time prior to and including at least certain zero crossing points of the AC voltage. The assembly also includes signal providing means, connected with the switch and responsive to at least the AC voltage, for presenting to the switch internally controlled ON and OFF command signals such that either an ON or OFF signal, but not both, is present entirely throughout the specific window of time, thereby preventing command signals from switching between ON and OFF states within any given window of time.

BRIEF DESCRIPTION OF THE DRAWINGS

The present invention will be described in more detail hereinafter in conjunction with the drawings, wherein.

DETAILED DESCRIPTION

Figure 3A:
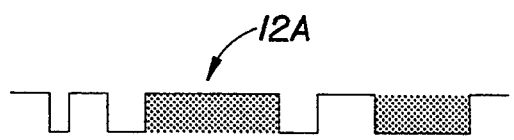
FIGS. 3A–3D graphically illustrate four different series of externally controlled command signals provided for controlling a zero crossing switch forming part of the overall DC controlled switching assembly illustrated in FIG. 1.
Figure 3B:
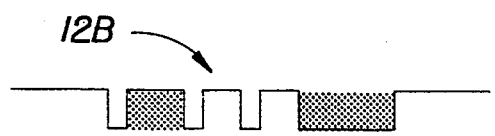
Figure 3C:
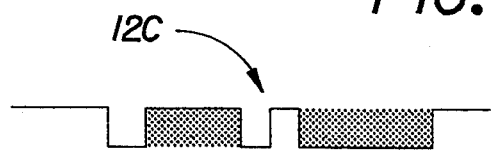
Figure 3D:
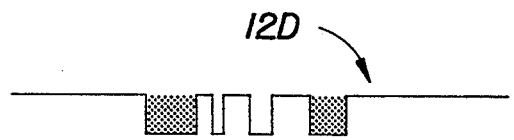
Figure 4A:
FIGS. 4A and 4B graphically illustrate respective series of internally controlled command signals forming part of an improved DC controlled switching assembly designed in accordance with the present invention.
Figure 4B:

In order to more fully appreciate the present invention, reference is initially made to FIGS. 4A and 4B in conjunction with FIGS. 3C and 3D. FIG. 4A depicts a series 16A of internally produced command signals and a similar series is depicted in FIG. 4B at 16B. Each of these series of internal command signals is shown synchronized in time with the externally controlled command signals 12 and with AC voltage 14. Note specifically that the shaded ON signal of series 16A extends through the entire extent of window PW, thereby insuring that the zero crossing switch 10 turns ON as the voltage 14 crosses its zero crossing point ZC. As will be described in more detail hereinafter, in a preferred embodiment, this ON pulse is initially triggered into production by the co-presence of an ON pulse forming part of the externally controlled command signals and a predetermined triggering point on the AC voltage 14.

For example, the left-most shaded ON pulse of series 12D in FIG. 3D is present at the time the preselected triggering point T1 appears on the AC voltage wave form 14. The triggering point T1 is well ahead of the performance window PW and, hence, the internally produced shaded ON pulse 16A illustrated in FIG. 4A is initiated well before the beginning of the performance window. Circuitry will be described hereinafter for insuring that the internally controlled shaded ON pulse continues uninterrupted throughout the performance window, even though the externally controlled series of external command signals transition between ON and OFF states, as exemplified by series 12D. A similar situation exists if the switch is to be turned OFF from an ON state, as depicted by the shaded OFF pulse forming part of internally controlled command signals 16B. Note that this later shaded OFF pulse is initiated by, for example, any of the shaded OFF pulses shown in externally controlled command signals 12A, 12B or 12C. In a particular embodiment of the present invention, once an internally controlled ON or OFF command signal is produced, it remains on for a full cycle, as illustrated in FIGS. 4A and 4B. At the end of that time a second triggering point T1 is used to determine whether the switch 10 should be turned OFF from an ON state or ON from an OFF state, as indicated by dotted lines in FIGS. 4A and 4B.

Figure 5:
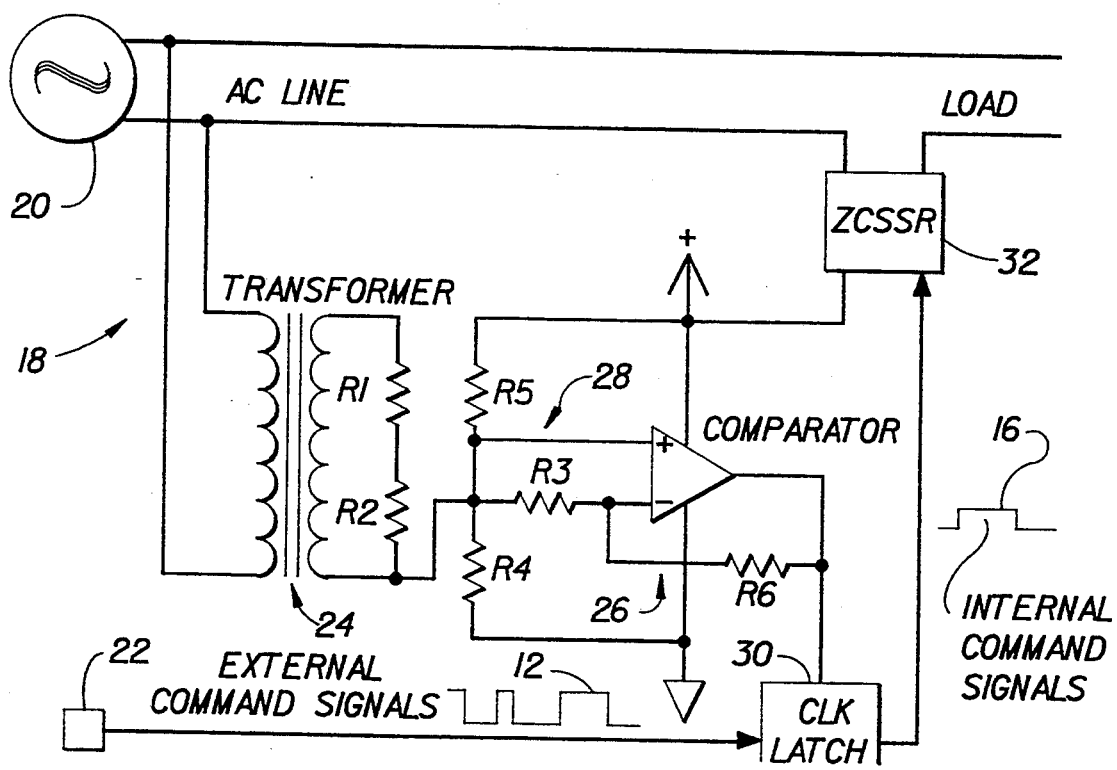
FIG. 5 schematically illustrates a DC controlled switching assembly which is designed in accordance with the present invention and produces and utilizes the internally controlled command signals shown in FIGS. 4A and 4B.
Figure 6:
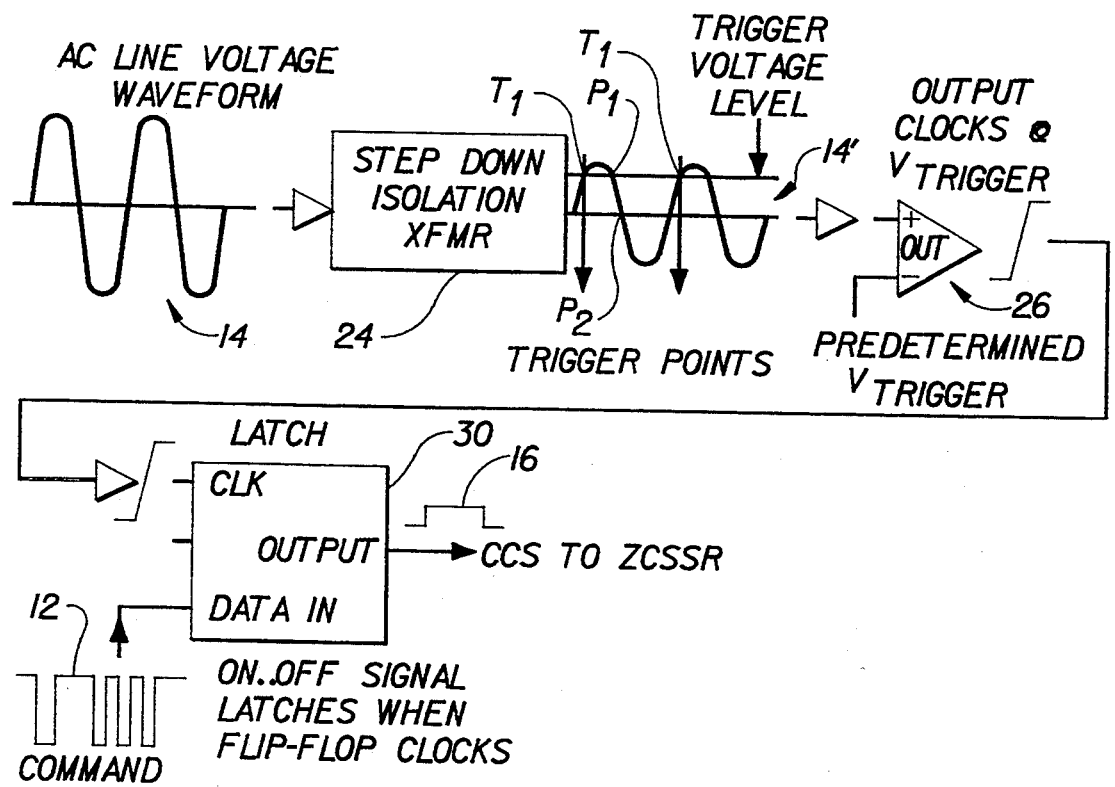
FIG. 6 diagrammatically illustrates the way in which the assembly of FIG. 5 operates in accordance with the present invention.

Attention is now directed to FIGS. 5 and 6. As stated heretofore, FIG. 5 illustrates a DC controlled switching assembly designed in accordance with the present invention for connecting a source of zero crossing AC voltage to and disconnecting it from an AC load line. The assembly is generally indicated by the reference numeral 18. For purposes of discussion, it will be assumed that this assembly is acting upon previously described zero crossing AC voltage 14 from a suitable AC voltage source 20 and is externally controlled by means of previously recited external command signals 12 shown in FIGS. 3A–D from a suitable source of such signals generally indicated at 22. One actual working example of assembly 18 is a temperature controller where the load is comprised of one or more heating elements and the externally controlled command signals 12 are generated by a thermostat or other such sensing device.

Still referring to FIG. 5. DC controlled switching assembly 18 is shown including a step down isolation transformer 24 having one side thereof connected to the AC load line and its other side to the inputs of a comparator circuit 26 through a voltage dividing resistance network 28. The output of the comparator is shown driving the clock input of a flip flop latch circuit 30 which has its control input connected to source 22 for receiving externally controlled command signals 12. The previously described internally controlled command signals 16 are generated at the output of flip flop latch circuit 30 which, as shown in FIG. 5, is connected to the input of a cooperating zero crossing switch which also forms part of the overall assembly. In the case of assembly 18, the particular zero crossing switch shown is a zero crossing solid state relay 32, although it should be clear that the present invention is not limited to such a device.

Figure 1:
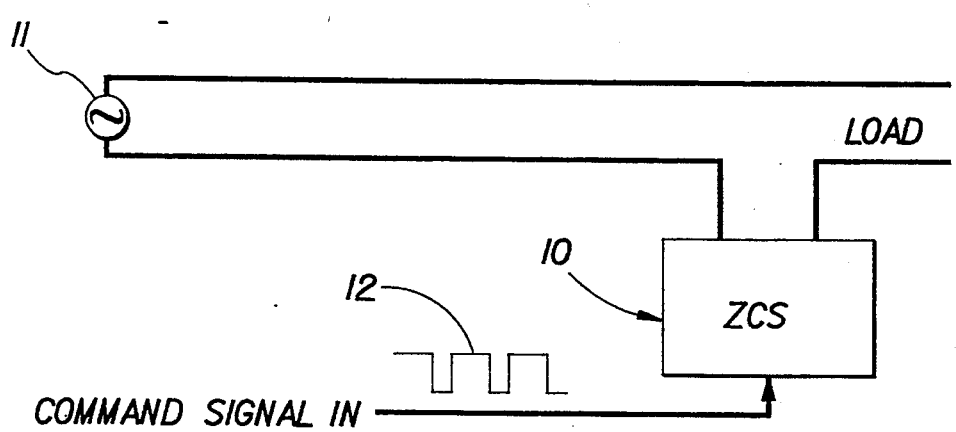
FIG. 1 diagrammatically illustrates a DC controlled switching assembly designed in accordance with the prior art for connecting a source of zero crossing AC voltage to and disconnecting it from an AC load.
Figure 2:
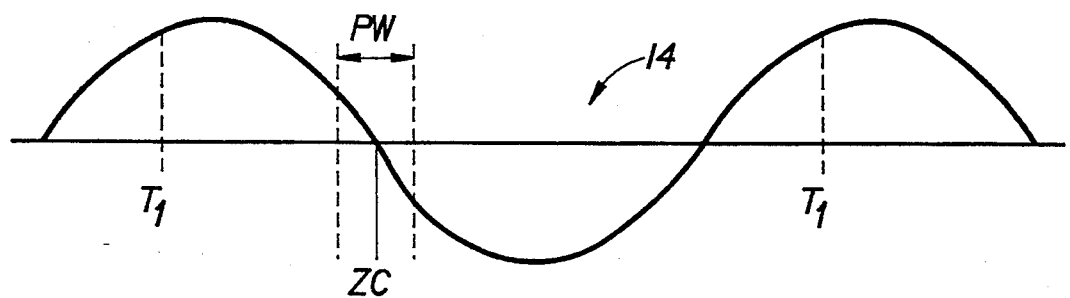
FIG. 2 graphically illustrates one and one-half cycles of the zero crossing AC voltage associated with the assembly of FIG. 1.

Having generally described assembly 18 from a structural standpoint, attention is now directed to the way in which it internally controls its zero crossing solid state relay 32 in order to connect AC voltage source 20 to and disconnect it from its associated load. At the outset, the triggering point T1 for initiating an internally controlled ON/OFF command signal 16 is established by the appropriate selection of resistors R3 and R4 which provide a referenced threshold for comparator circuit 26. Resistors R5 and R6 are selected to provide hysteresis in order to eliminate false triggering. In an actual working embodiment, the resistors R1 and R2 are selected to be equal so that the assembly can easily switch between 110 and 20 AC voltage. For purposes of discussion it will be assumed that the triggering point T1 is set slightly below and on the positive-going side of the positive peak point of the AC wave form, as shown in FIG. 2. As will be described immediately below, the combination of comparator circuit 26 and flip flop latch 30 serves to maintain the presence of an internally generated ON or OFF command signal 16 for a full cycle from this triggering point, as stated previously. In order to turn on or close relay 32 in order to connect voltage source 20 to its load from a disconnected OFF condition, an externally controlled ON command signal 12 must be present at trigger point T1. Once that condition is met, the assembly immediately produces internally controlled ON command signal 16A for a full cycle and, therefore, entirely through the previously described performance window PW which, as stated, contains the zero crossing point of the voltage waveform. This, in turn, ensures that the relay 32 will turn on and thereby connect the AC voltage to its load. In the same manner, the relay 32 may be turned off from an ON state for disconnecting the AC voltage source from its load by generating an externally controlled OFF command signal 12 at trigger point T1 in order to produce a full cycle internally generated OFF command signal 16B.

Having described DO control switching assembly 18 structurally and generally the way in which it operates to produce full cycle internal command signals 16 from external command signals 12, attention is now directed to a more detailed description of the way in which the assembly operates. In this regard, reference is made to FIG 6. As seen there, the step down transformer 24 steps down AC voltage 14 to a more manageable level for comparator circuit 26, as indicated at 14'. Note that the triggering points T1 are depicted on this reduced waveform which also is shown including points P1 and P2 for reasons to be explained. As the AC voltage waveform 14' rises from its zero voltage level towards it first trigger point T1, the output of comparator circuit 26 remains high. When the voltage reaches T1, the negative input to the comparator reaches the voltage at the referenced threshold positive input, thereby causing the output of the comparator circuit to go low. This, in turn, drags the positive reference input with it, thereby preventing the comparator circuit from triggering again at point P1. However, when the AC waveform reaches point P2, the negative input of the comparator circuit is now equal to the reduced positive threshold input, thereby triggering the comparator circuit so that its output is again high in preparing it to go low again at the next trigger point T1. As stated previously the output to comparator circuit 26 is connected to the clock input of flip flop latch circuit 30. The output of this later circuit latches into either a low (ON) or high (OFF) state at each trigger point depending on whether a low (ON) or high (OFF) external command 12 is present at its data input at the same time, as stated previously. Since the comparator circuit does not again switch from a high state to a low state until the next triggering signal T1, the output of the latch circuit remains fixed for that period of time which, in the example illustrated, is one full cycle. Thus, the internal ON/OFF command signal 16 is provided for a full cycle.

Figure 7:
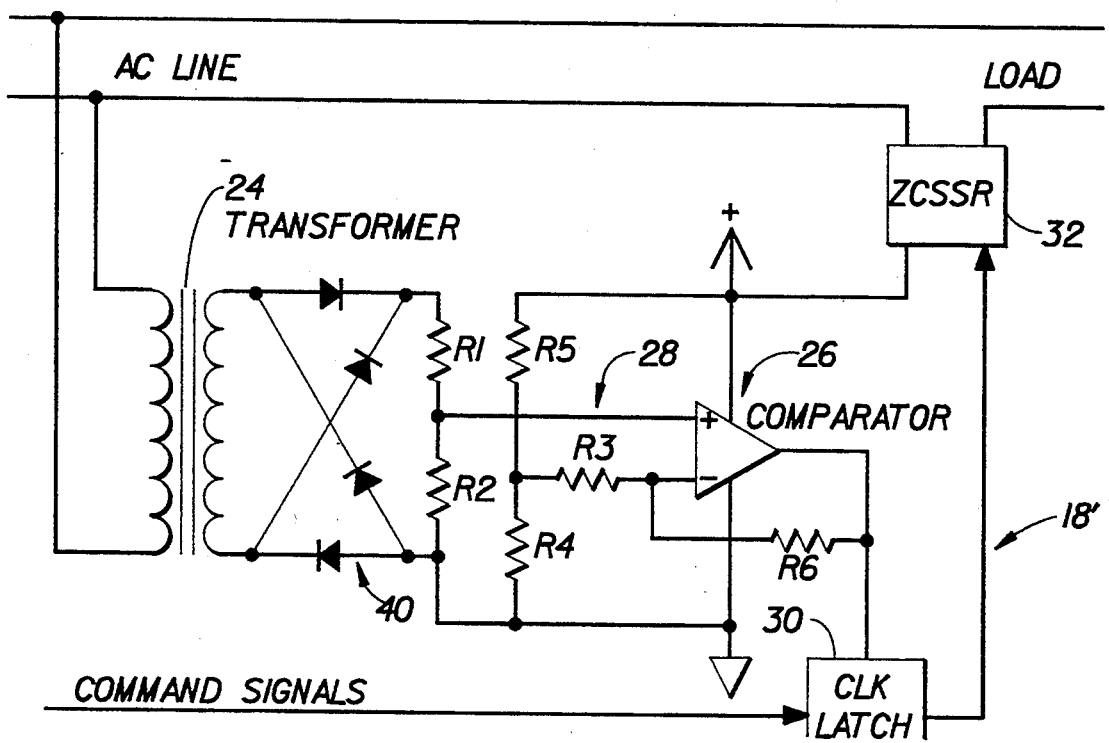
FIG. 7 schematically illustrates a DC controlled switching assembly designed in accordance with a second embodiment of the present invention.

Here described overall DC controlling switching assembly 18 in detail, from both the structural and operational standpoint, it is to be understood that the various circuit components making up this assembly are readily providable in view of the disclosure herein and that the present invention is not limited to a particular type of zero crossing switch such as the zero crossing solid state relay illustrated. Moreover, the triggering point T1 can vary as can the duration of internally controlled ON/OFF command signals 16 so long as these later command signals extend entirely throughout the performance window PW of the particular zero crossing switch being used. With regard to duration, for example, the internally controlled ON/OFF command signals could be provided every half cycle. A DC controlled switching assembly 18' illustrated in FIG. 7 may be provided to that end. Note that this latter assembly includes all of the components of assembly 18, along with a diode arrangement 40 disposed between the output of the transformer 24 and the input of the voltage divider network 28.

What is claimed is:

1. A DC controlled switching assembly for connecting a source of zero crossing AC voltage to and disconnecting it from an AC load line, said assembly comprising:
   (a) a zero crossing switch connectable with said AC voltage source and said AC load line adapted to connect said load line to and disconnect it from said voltage source in response to ON and OFF command signals, but only if and when the appropriate command signal is present entirely throughout a window of time beginning a specific period of time prior to and including at least certain zero crossing points of said AC voltage; and
   (b) signal providing means connected with said switch and responsive to at least said AC voltage for presenting to said switch internally controlled ON and OFF command signals such that either an ON or OFF signal, but not both, is present entirely throughout said specific window of time, thereby preventing the internally controlled command signals from switching between ON and OFF states within any given window of time.

2. An assembly according to claim 1 wherein said signal providing means is responsive to both said AC voltage and a series of externally controlled ON and OFF command signals for presenting said internally controlled command signals to said switch.

3. An assembly according to claim 2 wherein said window of time includes a specific period of time following each of said certain zero crossing point of said AC voltage.

4. An assembly according to claim 2 wherein said signal providing means includes circuit means for initiating the beginning point of any given internally controlled ON or OFF signal when a corresponding one of said externally controlled signals is present simultaneously with a beginning trigger point of said AC voltage ahead of said window of time and for maintaining the presence of said initiated signal for a predetermined period including said window of time, even if the externally controlled command signals thereafter change within said predetermined period.

5. An assembly according to claim 4 wherein said predetermined period extends beyond said window of time.

6. An assembly according to claim 5 wherein said predetermined period corresponds to one full cycle of said AC voltage.

7. An assembly according to claim 5 wherein said predetermined period corresponds to one half-cycle of said AC voltage.

8. An assembly according to claim 4 wherein said circuit means includes a comparator circuit adapted for connection with said AC voltage for establishing said beginning trigger point and producing a responsive latch control output signals, and a latch circuit having one input adapted to receive said externally controlled command signals, a second input connected to said comparator for receiving said latch control output signals, and an output connected to said switch for proving said internally controlled command signals.

9. An assembly according to claim 1 wherein said switch is a zero crossing solid state relay.

10. A method of controlling a zero crossing switch for connecting a source of zero crossing AC voltage to and disconnecting it from an AC load line, said method comprising the steps of:
(a) producing externally controlled command signals intended to control when said switch connects and disconnects said load line to and from said AC voltage;
(b) selecting a specific window of time beginning a specific period of time prior to and including at least certain zero crossing points of said AC voltage;
(c) in response to said AC voltage and said externally controlled signals, producing internally controlled signals for actually controlling when said switch connects and disconnects said load line to and from said AC voltage, said internally controlled signals being produced such that either an ON or OFF signal, but not both, is present entirely throughout said specific window of time in order to prevent command signals from switching between ON and OFF states within any given window of time.

11. A method according to claim 10 wherein said window of time includes a specific period of time following each of said certain zero crossing point of said AC voltage.

12. A method according to claim 10 wherein said step of producing said internally controlled signals includes initiating the beginning point of any given internally controlled ON or OFF signal when a corresponding one of said externally controlled signals is present simultaneously with a beginning trigger point on said AC voltage ahead of said window of time and for maintaining the presence of said initiated signal a predetermined period including said window of time, even if the externally controlled command signals thereafter change within said predetermined period.

13. A method according to claim 12 wherein said predetermined period extends beyond said window of time.

14. A method according to claim 13 wherein said predetermined period corresponds to a one full cycle of said AC voltage.

15. A method according to claim 13 wherein said predetermined period corresponds to one half-cycle of said AC voltage.

16. An arrangement for controlling a zero crossing switch for connecting a source of zero crossing AC voltage to and disconnecting it from an AC load line, said arrangement comprising:
(a) means for producing externally controlled command signals intended to control when said switch connects and disconnects said load line to and from said AC voltage;
(b) means for selecting a specific window of time beginning a specific period of time prior to and including at least certain zero crossing points of said AC voltage;
(c) means responsive to said AC voltage and said externally controlled signals for producing internally controlled signals that actually control when said switch connects and disconnects said load line to and from said AC voltage, said internally controlled signals being produced such that either an ON or OFF signal, but not both, is present entirely throughout said specific window of time in order to prevent command signals from switching between ON and OFF states within any given window of time.

* * * * *